United States Patent [19]
Nariman et al.

[11] Patent Number: 6,146,952
[45] Date of Patent: *Nov. 14, 2000

[54] SEMICONDUCTOR DEVICE HAVING SELF-ALIGNED ASYMMETRIC SOURCE/DRAIN REGIONS AND METHOD OF FABRICATION THEREOF

[75] Inventors: Homi E. Nariman; H. Jim Fulford; Charles E. May, all of Austin, Tex.

[73] Assignee: Advanced Micro Devices, Sunnyvale, Calif.

[*] Notice: This patent is subject to a terminal disclaimer.

[21] Appl. No.: 09/164,836

[22] Filed: Oct. 1, 1998

[51] Int. Cl.[7] .................................. H01L 21/336
[52] U.S. Cl. ........................... 438/286; 257/401
[58] Field of Search .................. 438/286, 179; 257/401

[56] References Cited

U.S. PATENT DOCUMENTS

| | | | |
|---|---|---|---|
| 5,296,398 | 3/1994 | Noda | 438/179 |
| 5,783,457 | 7/1998 | Hsu | 438/302 |
| 5,893,739 | 4/1999 | Kadosh et al. | 438/286 |

OTHER PUBLICATIONS

S. Wolf and R.N. Tauber, Silicon Processing for the VLSI Era—Process Technology, (Lattice Press, California, 1986) pp. 321–327, 384–397.

S. Wolf, Silicon Processing for the VLSI Era—Process Integration, (Lattice Press, California, 1990) pp. 238–239.

*Primary Examiner*—Amir Zarabian
*Assistant Examiner*—Christian D. Wilson

[57] ABSTRACT

A semiconductor device and manufacturing method is provided in which asymmetric source/drain regions are formed using a self aligning implant mask. A gate electrode is formed on a substrate and a dielectric layer is formed over the substrate and adjacent the gate electrode. A masking layer is formed over the dielectric layer and the gate electrode and selectively removed to form an implant mask. The implant mask extends further over a first side of the gate electrode than a second side of the gate electrode. Using the implant mask for alignment, a dopant is implanted into the active regions of the substrate adjacent the gate electrode to form a first heavily-doped region adjacent the first side of the gate electrode and second heavily-doped region adjacent the second side of the gate electrode. The first heavily-doped region is spaced further from the gate electrode than the second heavily-doped region. Contacts may be formed to the masking layer or a silicide layer formed from the masking layer.

20 Claims, 4 Drawing Sheets

SEMICONDUCTOR DEVICE HAVING SELF-ALIGNED ASYMMETRIC SOURCE/DRAIN REGIONS AND METHOD OF FABRICATION THEREOF

FIELD OF THE INVENTION

The present invention is directed generally to semiconductor devices and, more particularly, to a semiconductor device having asymmetric source/drain regions and a method of forming such a semiconductor device.

BACKGROUND OF THE INVENTION

Over the last few decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103, typically a polysilicon line, acts as a conductor. An input signal is typically applied to the gate electrode 103 via a gate terminal (not shown). Heavily doped source/drain regions 105 are formed in the semiconductor substrate 101 and are connected to source/drain terminals (not shown). As used herein, the term source/drain region refers generally to an active region used for the formation of a source or drain. As illustrated in FIG. 1, the source/drain regions 105 of a typical MOS transistor are symmetrical. Whether a region acts as a source or drain thus depends on the respective applied voltages and the type of device being made (e.g., PMOS, NMOS, etc.).

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

The source/drain regions 105, illustrated in FIG. 1, are lightly-doped-drain (LDD) structures. Each LDD structure includes a lightly-doped, lower conductivity region 106 near the channel region 107 and a heavily-doped, higher conductivity region 104 typically connected to the source/drain terminal. Typically, the LDD structures are formed by: implanting, using the gate electrode 103 for alignment, a first dopant into active regions adjacent the gate electrode at relatively low concentration levels to form the lightly-doped regions 106; forming spacers 108 on the gate electrode; and implanting, using the spacers 108 for alignment, a second dopant into the active regions at higher concentration levels to form the heavily-doped regions 104. The substrate is then annealed to drive the dopant in the heavily-doped regions deeper into the substrate 101.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Large numbers of such semiconductor devices are used as basic building blocks for most modern electronic devices. In order to increase the capability and performance of electronic devices implemented using semiconductor devices, it is desirable to increase the number of semiconductor devices which may be formed on a given surface area of a chip wafer. It is also desirable to increase the operating speed, reliability and performance of the semiconductor devices. To accomplish these goals, it is desirable to reduce the size of the semiconductor devices without degrading their performance. It is also desirable to increase operating performance and speed of the devices. New semiconductor fabrication processes and devices are therefore needed to continue the trend of reduced semiconductor device size and increased performance.

SUMMARY OF THE INVENTION

Generally, the present invention relates to a semiconductor device and manufacturing method in which self-aligned asymmetric source/drain regions of a semiconductor device are formed using a self-aligning implant mask.

In one embodiment of the invention, a gate electrode is formed on a substrate. A dielectric layer is formed over the substrate and adjacent the gate electrode. A masking layer is formed over the dielectric layer and the gate electrode and portions of the masking layer are selectively removed to form an implant mask which extends further over a first side of the gate electrode than a second side of the gate electrode. Using the asymmetric implant mask for alignment, a dopant is implanted into the active regions of the substrate adjacent the gate electrode to form a first heavily doped region adjacent the first side of the gate electrode and a second heavily doped region adjacent the second side of the gate electrode. The first heavily doped region is spaced further from the gate electrode than the second heavily doped region.

A semiconductor device, in accordance with an embodiment of the invention, includes a substrate and at least one gate electrode disposed over the substrate. First and second heavily-doped regions are also disposed in the substrate. The first heavily doped region is spaced further from the gate electrode than the second heavily doped region. An asymmetric conductive layer is disposed on top of the gate electrode and extends further outward from a first side of the gate electrode adjacent the first heavily doped region than a second side of the gate electrode adjacent the second heavily doped region. A contact for the gate electrode is formed which contacts the conductive layer.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
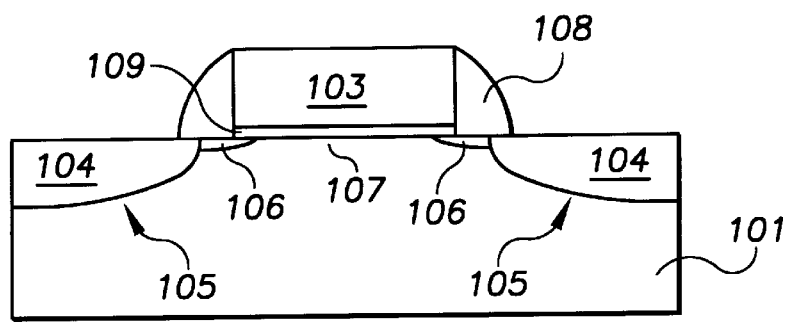
FIG. 1 illustrates one typical MOS semiconductor device structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally applicable to the formation of asymmetric source/drain regions in a number of semiconductor devices, including in particular MOS structures, such as PMOS, NMOS, CMOS and BiCMOS device. The invention is particularly suited to the formation of asymmetric LDD (lightly-doped drain) source/drain regions for small scale devices (e.g., devices having gate widths of 0.25 microns or less). While the present invention is not so limited, an appreciation of various aspects of the invention will be gained through a discussion of the fabrication process and characteristics of such a device in connection with the examples provided below.

FIGS. 2A–2E illustrate a process for fabricating a semiconductor device having asymmetric source/drain regions formed using a self-aligning implant mask. Using known techniques, gate electrodes 203 (only one of which is shown) are formed on a substrate 201. The substrate 201 is typically formed from a semiconductor material, such as silicon, for example. The gate electrode 203 is often formed from polysilicon and typically insulated from the substrate 201 by a thin gate insulating layer (not shown), such as an oxide layer. The gate electrode 203 generally has a relative narrow width w and depth d as compared to its length. While the invention is not limited to any particular dimensions, typical widths w of the gate electrode 203 range from about 0.18 to 0.5 microns, and typical depths d range from about 1000 to 3000 angstroms (Å). It will be appreciated that a number of different known fabrication techniques could be used to obtain the gate electrode structure depicted in FIG. 2A.

Figure 2A:
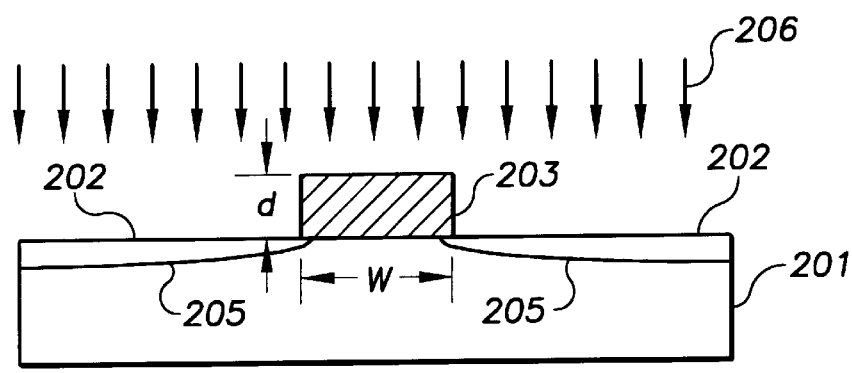
FIGS. 2A–2E illustrate a fabrication process in accordance with one embodiment of the invention.

Portions of the semiconductor substrate 201 which lie adjacent the gate electrode 203 generally define active regions 202 of the substrate 201. As used herein, the term active region encompasses a region where an active portion of the device resides whether the active portion has been or will be formed. The active regions 202 may serve, for example, as source/drain regions of a semiconductor device. In the illustrative embodiment of FIGS. 2A–2E, the active regions 202 serve as LDD source/drain structures. LDD structures are illustrated in FIG. 2E.

Following formation of the gate electrode 203, lightly doped regions 205 may be formed in the substrate 201 adjacent the gate electrode 203. The lightly doped regions 205 may, for example, be formed by implanting a relatively low dose of a dopant 206 at relatively low energy levels. This may be done using well known implantation techniques. The type of dopant 206 may either by an n-type dopant or a p-type dopant depending on the type of device be formed (e.g., PMOS or NMOS device). The dopant 206 may be implanted using the gate electrode 203 for alignment as illustrated or, alternatively, small spacers may be formed on sidewalls of the gate electrode 203 to space the implant from the gate electrode 203. Where LDD source/drain regions are not desired, the formation of the lightly-doped regions 205 may be omitted. The resultant structure is illustrated in FIG. 2A.

Next, spacers 207 are formed on sidewalls of the gate electrode 203. The spacers 207 may be formed from a number of different dielectric materials, including oxides such as silicon dioxide, using known spacer formation techniques. One of the spacers 207 will be used to space a heavy source/drain implant from the gate electrode 203. The thickness of the spacers 207 is suitable selected in consideration of this spacing. Suitable thickness of the spacers 207 range from 200 to 700 Å for many applications.

Figure 2B:
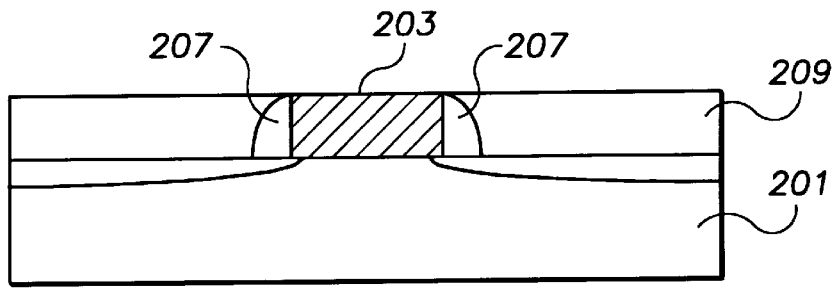

A dielectric layer 209 is then formed adjacent the gate electrode 203, as illustrated in FIG. 2B. The dielectric layer 209 is typically formed from a material which may be selectively removed with respect to the spacers 207 and gate electrode 203. Suitable materials include silicon oxynitride or silicon nitride, for example. The dielectric layer 209 may be formed by depositing a layer of the dielectric material over the substrate 201 and planarizing the dielectric material, typically to expose an upper surface of the gate electrode 203. The deposition and planarization may be done using, for example, well-known deposition and polishing techniques. This may be followed by a polish of the gate electrode 203 in order to buff the upper surface of the gate electrode 203. Typically, the planarization of the dielectric layer 209 and polish of the gate electrode 203, if any, are performed using etchants which are selective to the layer being planarized or polished.

Figure 2C:
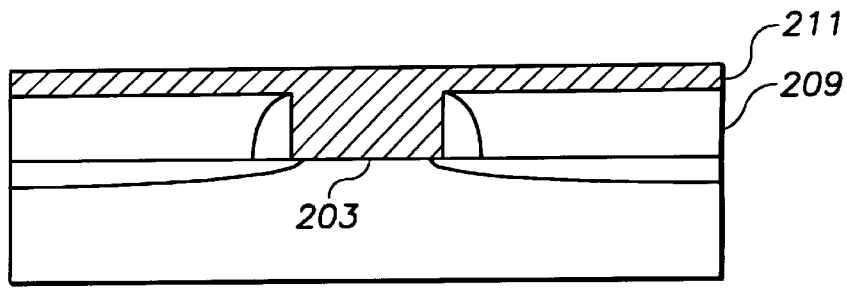
Figure 2D:
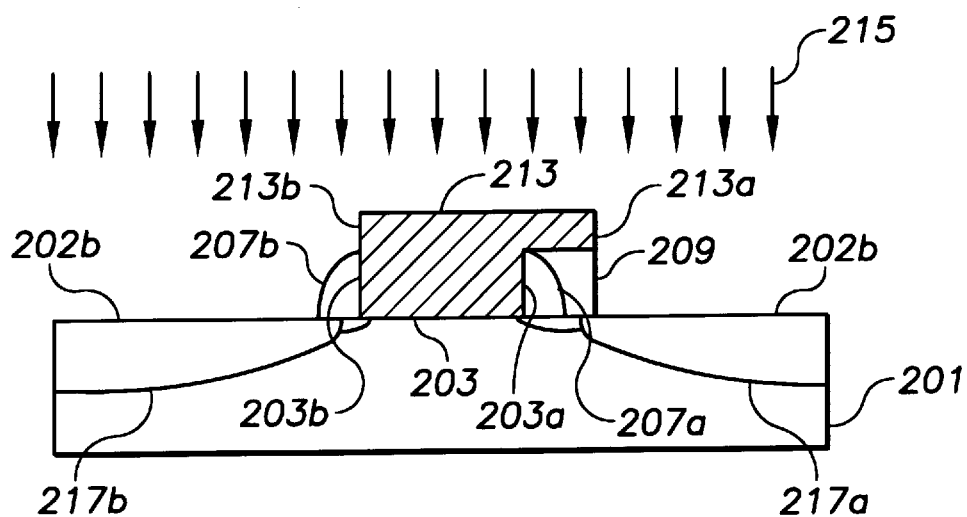
Figure 2E:
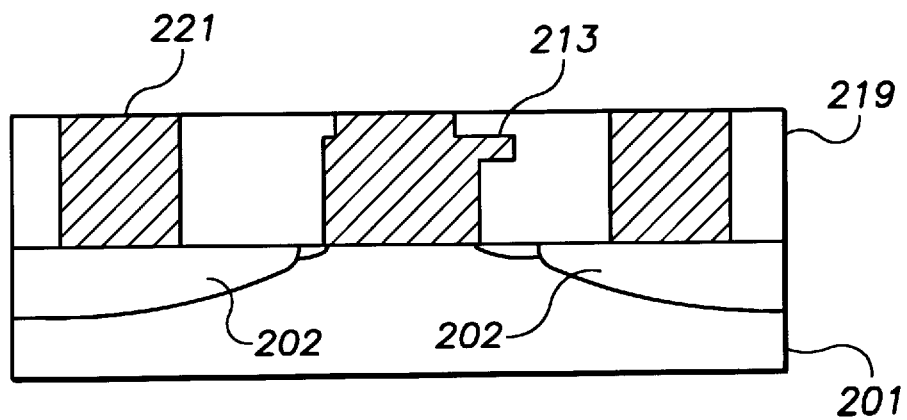

A masking layer 211 is formed over the dielectric layer 209 and gate electrode 203, as illustrated in FIG. 2C. The masking layer 211 will be selectively removed to form a self-aligning implant mask for an asymmetric source/drain implant. In the illustrated embodiment, the masking layer 211 is formed from a metal or metal alloy or polysilicon using, for example, well-known deposition techniques. Suitable thicknesses of the masking layer 211 range from about 500 to 2,000 Å for many applications.

Portions of the masking layer 211 are removed to form an implant mask 213. Underlying portions of the dielectric layer 209 may also be removed to typically expose the active regions 202 of the substrate 201. The masking layer 211 and underlying portions of the dielectric layer 209 may be selectively removed using, for example, well-known photolithography and etching techniques. The removal of these layers may be performed sequentially or in the same step depending on the type of etchants being used. Suitable etchants are selective to the masking layer 211 and dielectric layer 209 in order to leave spacer 207b on one side 203b of the gate electrode 203.

The implant mask 213 typically includes a first side 213a which extends further from the gate electrode 203 than the other side 213b. The extended side 213a of the implant mask 213 typically extends beyond the spacer 207a on the sidewall 203a of the gate electrode 203. The amount of this extension defines the spacing of a subsequent source/drain region in the active region 202b and can vary depending on the application. In this embodiment, the implant mask 213 extends beyond the sidewall 203a by about one half of the width of the gate electrode 203. Depending on the width of the gate electrode 203 and the width of the spacer 207a, the implant mask 213 may extend beyond the spacer 207a on the sidewall 203a by about 100 to 500 Å. The second side 213b of the implant mask 213 may be aligned with the gate sidewall 203b, as illustrated, or extend beyond or be recessed with respect to the sidewall 203b. Typically, extension of implant mask side 213b beyond the spacer 207b is avoided to allow the spacer 207b to define the spacing of a subsequently formed heavily doped region in active region 202b.

With the implant mask 213 in place, a relatively high dose of a dopant 215 is implanted in the substrate 201 at relatively high energy levels to form heavily doped regions 217a and 217b in the substrate 201. As a result of the asymmetry of the implant mask 213 relative to the gate electrode 203, the heavily doped region 217a is spaced further from the gate electrode 203 than the heavily doped region 217b.

The asymmetry of the source/drain regions 217a and 217b can be used to exploit device physics and increase the reliability and performance of the device. For instance, the first source/drain region 217a (which has the higher resistance) may be coupled, directly or indirectly, to a relatively high voltage and the other source/drain region 217b may be coupled to a relatively low voltage, such as ground. In a NMOS device, for example, the first source/drain region 217a may used as a drain. Coupling the source/drain regions 217a and 217b in this manner can serve to reduce hot carrier effects in the device.

A layer 219 of dielectric material may be formed over the substrate 201. The dielectric layer 219 may be formed from a number of different dielectric materials including oxides, such as silicon dioxide, using, for example, well-known deposition techniques. Portions of the dielectric layer 219 may then be removed to form contact openings to the active regions 202 and implant mask 213. This may be done using, for example, well-known photolithography and etching techniques. The contact openings may then be filled with a conductive material 221, such as a metal, in order to form contacts to the underlying active devices. In this manner, the implant mask 218 forms a conductive layer which facilitates contacts to the gate electrode 203. The resultant structure is shown in FIG. 2E. Fabrication of the device may continue with known processing steps to complete the ultimate device structure.

Using the above process, asymmetric source/drain regions may be formed using a patterned mask. The asymmetric active regions may be exploited to increase the reliability and performance of the device by reducing the resistance on the source side. Moreover, the use of a conductive material, such as a metal, metal alloy or polysilicon, for the implant mask provides additional advantages. For instance, the conductive mask may be left in contact with the underlying gate electrode after source/drain formation and used as a base for a subsequent contact to the gate electrode. This can reduce the sheet resistance of the gate electrode and provide a larger foot print for the contact. This, in turn, allows for further scaling of the device. In particular, this allows for more reliable formation of devices having gate electrode widths of 0.18 microns or less.

Figure 3A:
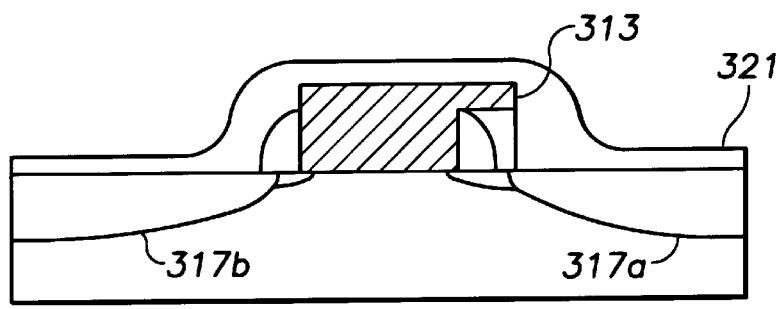
FIGS. 3A–3B illustrate another fabrication process in accordance with another embodiment of the invention.
Figure 3B:
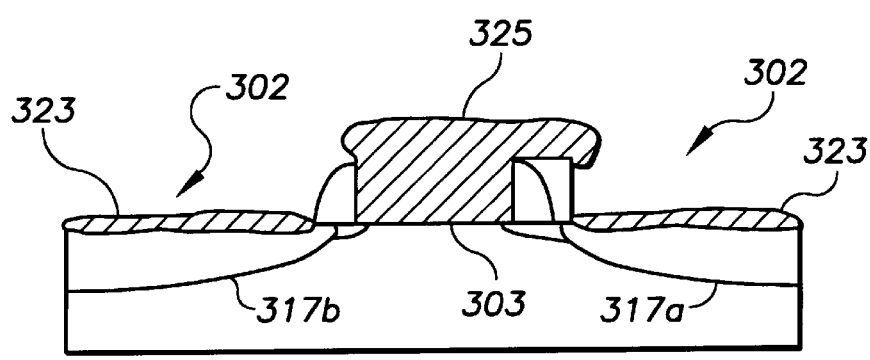

FIGS. 3A and 3B illustrate another embodiment of the invention using polysilicon as an implant mask. In this embodiment, the steps illustrated in FIGS. 2A–2D may be performed to provide the structure illustrated in FIG. 2D. Following formation of the asymmetric heavily doped regions 317a and 317b and without removal of the polysilicon implant mask 213, a layer of metal 321 may be formed over the substrate, as illustrated in FIG. 3A. A silicidation process may then be carried out to form silicide layers 323 over the active regions 302 and a silicide layer 325 over the gate electrode 203. The resultant structure illustrated in FIG. 3B. During the silicidation process, the metal layer 321 reacts with underlying silicon or polysilicon to form the silicide layer 323 and 325. As a result, the silicide layer 325 over the gate electrode 303 generally extends further from one side of the gate electrode 203 (i.e., the side having the source/drain region 217a which extends further from the gate electrode) than the other side. This results from the use of the asymmetric polysilicon implant mask 313 as a source of silicon for the silicide reaction.

Using the above process, a semiconductor device having asymmetric source/drain regions and a gate electrode silicide layer wider than the gate electrode may be formed. The asymmetric source/drain regions can exploit device physics and allow for improved performance at small device scales. The enlarged gate electrode silicide layer further improves device performance by, for example, increasing the contact area for a subsequent contact and decreasing the sheet resistance of the gate electrode 303.

Figure 4A:
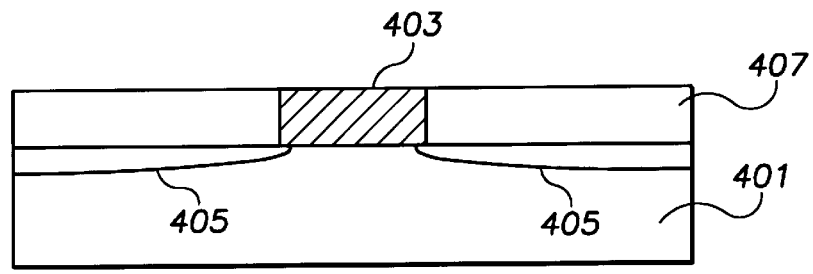
FIGS. 4A–4C illustrate another fabrication process in accordance with another embodiment of the invention.
Figure 4B:
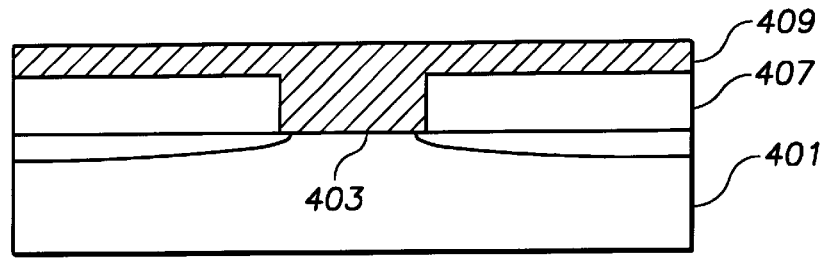
Figure 4C:
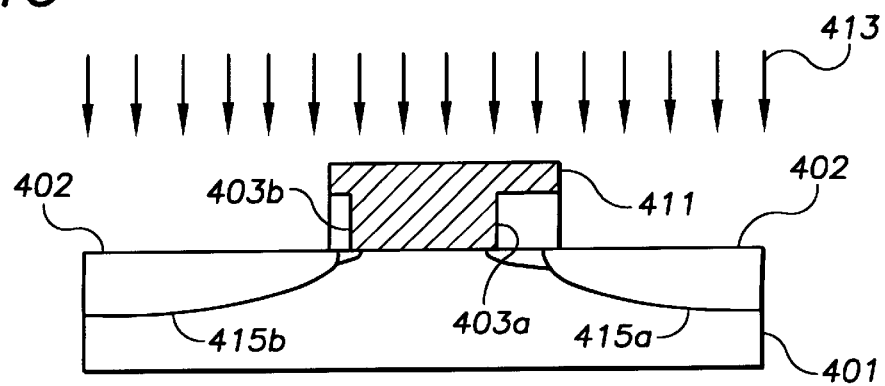

FIGS. 4A–4C illustrate another exemplary process for forming asymmetric source/drain regions in the substrate using implant mask. In this process, a gate electrode 403 is formed over a substrate 401 in a similar manner as discussed above. Lightly doped regions 405, if desired, may then be formed in active regions of the substrate 401 adjacent the gate electrode 403. Next, a dielectric layer 407 may be formed adjacent sidewalls of the gate electrode 403. The dielectric layer 407 may be formed in a similar manner as the dielectric layer 209 discussed above. The gate electrode 403 may also be lightly polished after planarizing the dielectric layer 407. The resultant structure is illustrated in FIG. 4A.

A masking layer 409 is then formed over the gate electrode 403 and the dielectric layer 407. Again, the masking layer 409 may be formed from a metal, a metal alloy or polysilicon in a similar manner as discussed above with respect to the masking layer 211. The resultant structure is illustrated in FIG. 4B.

Portions of the masking layer 409 are removed to form an asymmetric implant mask 411 which extends further beyond a first side 403a of the gate electrode 403 than a second side 403b. Underlying portions of the dielectric layer 407 may also be removed in order to typically expose the active regions 402 of the substrate 401. Using the implant mask 411 for alignment, a relatively high dose of a dopant 413 may be implanted into the substrate 401 at relatively high energy levels in order to form asymmetric first and second heavily doped regions 415a and 415b. By extending the mask 411 over each side 403a and 403b of the gate electrode 403, the heavily doped regions 415a and 415b may both be spaced from the gate electrode 403 without need for earlier-formed spacers. Moreover, the asymmetry of the implant mask 411 allows for the spacing of the first heavily doped region 415a to be further from the gate electrode 403 than the second heavily doped region 415b. This allows device physics to be exploited to improve device characteristics as discussed above. Processing may continue with contact formation as illustrated in FIG. 2E or FIG. 3A or 3B above, followed by known processing steps to complete the device structure.

The above processes are intended to be exemplary and not limiting. Various modifications may be made without departing from the scope of the invention. For instance, in some cases a thin silicide layer may be formed over the gate electrode prior to forming the implant mask. This may be desirable when using a metal or metal alloy mask, for example. In other embodiments, the implant mask may be removed prior to contact formation, in which case the contacts would contact the gate electrode (or a silicided region thereof). In addition, the implant mask may be formed of a dielectric material if desired. In this case, however, the benefits of a conductive implant mask or silicided implant mask (e.g., larger footprint and lower resistance) would be lost. Further, the implant mask may be removed prior to the heavy source/drain implant with the spacers and dielectric layer providing the masking. While, this allows the formation of asymmetric source/drain regions, the benefits of a conductive or silicided implant mask would be lost.

As noted above, the present invention is applicable to the fabrication of a number of different devices where an asymmetric source/drain is desirable. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of forming a semiconductor device, comprising:
   forming a gate electrode on a substrate;
   forming a dielectric layer over the substrate and adjacent the gate electrode including planarizing above the gate electrode;
   forming a masking layer over the dielectric layer and the gate electrode;
   selectively removing portions of the masking layer to form an implant mask over the gate electrode, the implant mask extending further over a first side of the gate electrode than a second side of the gate electrode; and
   implanting, using the implant mask, dopant into the active regions of the substrate adjacent the gate electrode to form a first heavily-doped region adjacent the first side of the gate electrode and a second heavily-doped region adjacent the second side of the gate electrode, the first heavily-doped region being spaced further from the gate electrode than the second heavily-doped region.

2. The process of claim 1, wherein forming the dielectric layer includes depositing a dielectric material over the substrate and the gate electrode and planarizing the dielectric material to expose an upper surface of the gate electrode.

3. The process of claim 2, further including polishing the upper surface of the gate electrode after planarizing the dielectric material.

4. The process of claim 1, further including implanting a second dopant into the substrate to form lightly-doped regions adjacent the gate electrode prior to forming the dielectric layer.

5. The process of claim 1, wherein selectively removing portions of the masking layer includes removing underlying portions of the dielectric layer.

6. The process of claim 5, wherein the implant mask extends beyond a spacer on the first side of the gate electrode.

7. The process of claim 1, wherein forming the masking layer includes depositing a metal or metal alloy over the dielectric layer and the gate electrode.

8. The process of claim 1, forming the masking layer includes depositing polysilicon over the dielectric layer and the gate electrode.

9. The process of claim 8, further forming a silicide layer using the polysilicon deposited over the gate electrode.

10. The process of claim 1, wherein the implant mask does not extend beyond the second side of the gate electrode.

11. The process of claim 1, wherein the implant mask extends beyond the first side of the gate electrode by about half the width of the gate electrode.

12. The process of claim 1, wherein the first heavily-doped region is coupled to a relatively high voltage source and the second heavily-doped region is coupled to a relatively low voltage source.

13. The process of claim 1, wherein the masking layer is formed directly on the gate electrode.

14. The process of claim 13, further including forming contacts to the masking layer or a silicide layer formed from the masking layer.

15. A process of forming a semiconductor device, comprising:
    forming a gate electrode on a substrate;
    implanting a first dopant into the substrate to form lightly-doped regions in the substrate adjacent the gate electrode;
    forming a dielectric layer over the substrate and adjacent the gate electrode leaving an upper surface of the gate electrode exposed;
    forming an asymmetric implant mask directly on the gate electrode and extending further over a first side of the gate electrode than a second side of the gate electrode;
    removing portions of the dielectric layer adjacent the mask;
    implanting, using the implant mask for alignment, a second dopant into the substrate to form asymmetric heavily-doped regions adjacent the gate electrode, the asymmetric heavily-doped regions including a first heavily-doped region adjacent the first side of the gate electrode and a second heavily-doped region adjacent the second side of the gate electrode, the first heavily-doped region being spaced further from the gate electrode than the second heavily-doped region; and
    forming a conductive contact to the gate electrode using the implant mask.

16. The process of claim 15, wherein the first heavily-doped region is coupled to a relatively high voltage source and the second heavily-doped region is coupled to a relatively low voltage source.

17. The process of claim 15, further including forming spacers adjacent sidewalls of the gate electrode prior to forming the dielectric layer, wherein removing portions of the dielectric layer includes exposing one of the spacers and implanting the second dopant includes using the exposed spacer as a mask.

18. The process of claim 15, wherein forming the masking layer includes depositing a metal or metal alloy over the dielectric layer and the gate electrode.

19. The process of claim 15, forming the masking layer includes depositing polysilicon over the dielectric layer and the gate electrode.

20. The process of claim 19, further forming a silicide layer using the polysilicon deposited over the gate electrode and forming the conductive contact includes using the silicide layer.

* * * * *